ELECTRICAL CIRCUIT MODULE AND METHOD OF MANUFACTURE

Filed June 7, 1967

INVENTORS
LEON B. HORNBERGER
MILTON J. STRIEF
BY
ATTORNEY

United States Patent Office 3,497,774

Patented Feb. 24, 1970

3,497,774

ELECTRICAL CIRCUIT MODULE AND METHOD OF MANUFACTURE

Leon B. Hornberger, Corona, and Milton J. Strief, Fullerton, Calif., assignors to Beckman Instruments, Inc., a corporation of California Filed June 7, 1967, Ser. No. 644,314

Int. Cl. H01b *1/04, 9/00;* H01l *11/00*

U.S. Cl. 317—101 9 Claims

ABSTRACT OF THE DISCLOSURE

An electrical circuit module including solid state active components in the form of discrete semiconductor chips, such as silicon or germanium transistor and diode chips, attached to a base member, which may be a nonconductive substrate or the like. The means for attaching the chips comprises an electrically conductive cermet material of finely divided conductive metal particles uniformly distributed throughout a fused glass binder. The fused cermet material forms a bond to one surface of the substrate and bonds to one electrode surface of a semiconductor chip with the conductive metal particles forming an electrically conductive path between the semiconductor chip and a conductive film attached to or deposited on a face of the substrate member.

The invention is directed to an electrical circuit module employing solid state active devices, such as silicon and germanium semiconductor chips, which are attached to base member or substrate and electrically connected to a conductive circuit formed on or otherwise attached to the base member. The invention also relates to a method for mounting a semiconductor device onto a base member or nonconductive substrate having attached thereto conductive circuitry.

The invention has wide application in the field of hybrid microcircuitry in which patterns of thin film conductors are applied to a ceramic or other type nonconductive substrate and active and passive electrical components are then applied or attached to the substrate. The circuit pattern forms interconnections between the respective components as well as forming terminations for the device. Sometimes metallic film resistors are formed on the substrate simultaneously with a thin film conductive pattern. In other practices, thick layer resistors, such as cermet resistors, and other passive components, such as capacitors or inductors, are added after the conductive connector pattern has been formed on the substrate surface. The discrete, active devices, such as transistors, diodes, and the like, are then attached to the circuit bearing substrate to produce a complete unit which may then be packaged or encapsulated.

The discrete, semiconductor devices may be formed as silicon or germanium chips which have been suitably processed by diffusion and other techniques to provide the required semiconductor electrical characteristics. One surface of a transistor or diode, such as the back surface, typically serves as a surface for bonding the chip to a carrier or substrate and may also be used for making an electrical connection. When the device is a transistor, this bonding surface may typically be the collector electrode. On a diode, the surface may be the cathode or anode. In some instances, the semiconductor or solid state active device is electrically attached to a conductive header or conductive pad which in turn connects with the electrical circuitry on the surface of the nonconductive substrate.

One or more of these active electrical components may be attached to the surface of a ceramic substrate or other base member and connected by the deposited film circuitry to each other or to one or more passive devices, such as resistors or capacitors which may also be attached to the surface of the base members. The substrate or base member may be any of the well known nonconductive base materials such as alumina, steatite, beryllia, or glass. Ceramic type materials are preferable because they can withstand relatively high temperatures and effectively insulate the active devices from one another and from the passive electrical components formed on the base member. However, even metallic base members may be employed if suitable insulating techniques are adopted.

One state-of-the-art technique for mounting silicon and germanium semiconductor chips to substrate or base members involves the eutectic bonding of semiconductor chips to gold metal surfaces formed on the surface of the substrate or base member. Examples of eutectic solders are gold-silicon and gold-germanium compositions. This method requires that a substantial layer of gold be deposited on the substrate, upon which the eutectic solder may be applied. The substrate is then heated to approximately 450° C. and the individual semiconductor chips are "scrubbed" or vibrated as the eutectic solder melts. When depositing gold or other noble metals to a ceramic substrate, it has been necessary in the past to apply an undercoating, such as a chromium film, to the substrate, in order to improve the adherence of the gold or other noble metal to the substrate. While a strong bond with reasonably low electrical resistance may be formed, provided the method is performed correctly, these techniques are complicated, costly and require substantial preparation of the substrate. In addition, where more than one semiconductor chip must be attached to a substrate and each chip must be individually positioned and scrubbed in order to produce a good bond, the time during which the previously attached semiconductor chips are exposed to high temperatures becomes quite substantial and damage to the semiconductor chip may result.

Another method employed for attaching semiconductor chips to a base member involves the use of a conductive epoxy for attaching the chips to the substrate. While conductive epoxies may be applied cold and the chips attached and cured at a relatively low temperature, the epoxy bond is not unusually strong and is subject to deterioration under certain environmental conditions. For example, many epoxy bonds cannot withstand high operating temperatures.

Accordingly, it is an object of the present invention to provide an improved electrical circuit module employing active semiconductor devices, such as transistors and diodes, having an improved bond for attaching such devices to a base member or header.

It is another object of the present invention to provide an improved method for attaching active semiconductor chips, such as silicon and germanium transistors and diodes, to a base member or header.

Further objects and advantages of the invention will become apparent as the following description proceeds and the features of novelty which characterize the invention will be pointed out with particularity in the claims annexed to and forming a part of this specification.

For a better understanding of the invention reference may be had to the accompanying drawing in which.

Figure 1:
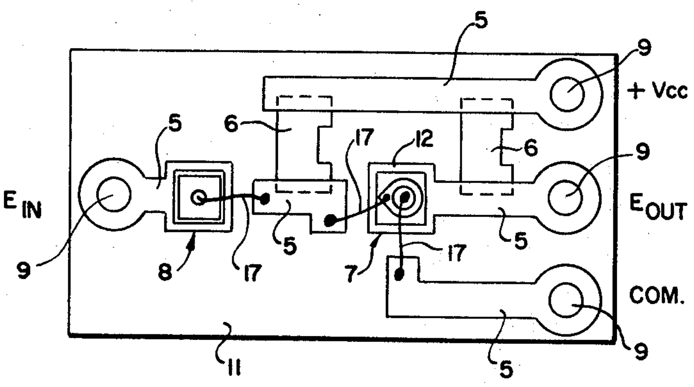
FIGURE 1 is a plan view of an electrical circuit module employing active semiconductor chips attached to a substrate base member according to the present invention.
Figure 2:
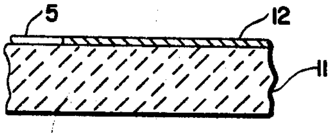
FIGURE 2 is an enlarged cross-sectional view of a section of a substrate having deposited thereon a conductive film layer.
Figure 3:
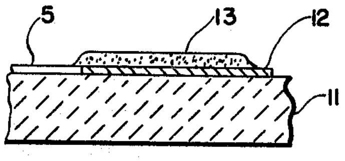
FIGURE 3 is an enlarged cross-sectional view of a substrate similar to that of FIGURE 2 with a layer of conductive cermet material deposited over the surface of a conductive film.

Referring now to FIGURE 1, there is shown an electrical circuit module including a base member 11 having deposited thereon an electrically conductive film in the form of a pattern adapted to form electrical connections between a number of passive and active electrical components also mounted on the base member. The electrically conductive film pattern 5 provides an electrical path connecting with resistance elements 6, a transistor 7 and a diode 8. The portions of the conductive pattern 5 adjacent the edges of the substrate take the shape of eyelets around the holes 9 formed through the substrate or base member 11. The pattern may extend into the holes 9 and provides terminations for the electrical circuitry. Pin type terminal members (not shown) are adapted to electrically connect with the electric circuit module through the holes 9.

While the microcircuit module illustrated in FIGURE 1 discloses one type of microcircuit device, it will be understood that there is no intention to limit the invention to the embodiment shown, but, on the contrary, it is intended to cover all such electrical circuit modules employing the concept for attaching semiconductor active devices, as hereinafter described.

Figure 4:
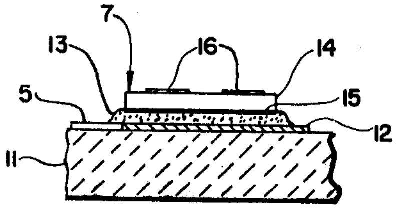
FIGURE 4 is an enlarged cross-sectional view of a substrate base member, similar to that of FIGURES 2 and 3, illustrating a transistor chip mounted on a cermet pad.
Figure 5:
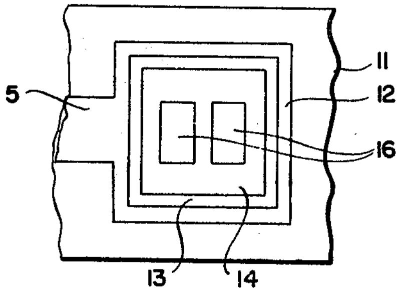
FIGURE 5 is a top view of the substrate and transistor chip of FIGURE 4.

Referring now to FIGURES 2–5, there is shown a segment of a ceramic substrate 11 as it progresses through the steps required to attach an active semiconductor chip to a base member in accordance with the present invention. The ceramic substrate or base member may be formed of alumina, steatite, beryllia or other ceramic material and is provided with at least one flat surface adapted to support the circuit elements. Bonded or otherwise attached to the surface of the base member or substrate 11 is a conductive film 5, which may be an etched circuit or a deposited layer conductive film of noble metal alloy or the like. The conductive film is laid in a pattern adapted for attachment to the passive and active elements forming the module circuit. In the preferred embodiment, as shown in FIGURE 5, the film 5 is bonded to the surface of the substrate 11 and at least one portion thereof assumes a shape conforming to the surface of the portion of the active device to be attached. In the illustrated embodiment of FIGURE 5 the portion 12 of the film is rectangular in shape and forms a header or termination pad for attachment for a semiconductor device. Header 12 connects directly with the circuit film 5 and may be of the same material and deposited with the film pattern 5.

Deposited on the surface of the termination pad or header 12 is a cermet material (see FIGURE 3) 13 which is applied by brushing, stenciling, silk screening or any preferred method. The cermet material is best applied as a paste which comprises a homogeneous mixture of noble metal particles and glass or vitreous enamel particles mixed with a volatile liquid carrier. Such a cermet material can be very precisely silk screened to any preferred depth such as from .0001 inch to .010 inch or more in any desired pattern. While the depth of the cermet layer is not critical, it is preferably such as to permit the semiconductor chip to be placed on top thereof with portions of the cermet surrounding the outer edges of the chip and extending slightly above the outer edges and the collector electrode 15 deposited on the lower surface of the chip. (See FIGURE 4.) The cermet material comprises a high concentration of conductive metal particles throughout the mixture so that a good conductive path is formed between the particles, the termination pad 12 and the collector electrode 15.

A discrete active device, such as the transistor chip 7 shown in FIGURE 4, is typically fabricated of silicon or germanium. A gold or other metal backing 15 which, as stated above, may be attached to a back surface of the chip to form the collector electrode of the device. Contact pads attached to the upper surface of the chip may be formed of aluminum or other suitable conductive metal. These pads in the case of the transistor chip, are electrically connected to the base and emitter portions of the chip and provide suitable terminations for attachment of leads. The active device or chip 7 is positioned in the "wet" layer of cermet paste while the substrate and cermet material are at room temperatures. After one or more of the chips have been properly located on cermet layers deposited on the substrate, the assembly is placed in an oven and heated to drive off the solvents used in the "wet" layer 13 of cermet and to cause the glass material in the cermet mixture to form a sintered mass or fuse into a continuous glassy phase, with the particles of metal uniformly distributed throughout the glass. Preferably the assembly is heated in two steps. First, to a temperature of approximately 70–80° C. for about 10 to 15 minutes to drive out all of the solvents and organics contained in the volatile carrier. Then the assembly is subjected to a reducing atmosphere, such as 10–20% hydrogen and 80–90% nitrogen, and heated to a temperature of approximately 400° C. for a period of about 1–5 minutes. The reducing atmosphere prevents oxidation of the conductor material forming the thin film pattern and the aluminum pads on the transistor chip. During this latter stage, the remaining organics contained in the cermet paste 13 are driven off and the glass is caused to soften and form a sintered mass, or the glass may be caused to melt and fuse into a continuous glassy phase, with the metal particles uniformly distributed in electrically conductive relation throughout the fused glass. The assembly is then removed from the hot stage and allowed to cool at room temperatures.

The fused glass forms a solid bond between the surfaces of the termination pad or header 12 and the lower surface of the active semiconductor chip 7. After the assembly has cooled, leads 17 (see FIGURE 1) may be connected by appropriate means to the base and emitter pad or to the other electrodes of the semiconductor device in order to complete the transistor installation on the module.

As previously pointed out, the cermet material, before fusion, is formed of glass and minute conductive metal particles. Preferably the particles are of noble metals such as silver, gold, palladium, platinum, ruthenium, iridium or rhodium, or alloys of these noble metals. The percentage of noble metal particles must be such that a good conductor is formed through the cermet mixture once it is fused to the substrate and to the semiconductor chip.

Since most present day semiconductor devices can withstand temperatures above 400° C. for only short periods of time without altering the characteristics of the device, it is necessary to provide a glass material which softens or melts readily at a temperature which will not cause damage to the semiconductor chip. Thus, in practice, it has been necessary in bonding presently known semiconductor chips to utilize a glass having a softening temperature of below 500° C. An example of such glass is a high lead devitrifying glass such as Glass ECV1002 sold by Kimble Glass Co., a division of Owens-Illinois Corp., Toledo, Ohio. Another glass which has been employed to make a low melting temperature cermet material for this purpose constitutes by weight 67% $Bi_2O_3$ and 33% CdO.

Obviously, if semiconductor chips are developed which are capable of withstanding higher temperatures, then other glasses having higher melting temperatures may be employed.

In practice, the noble metals are mixed with the glass materials and the entire mixture milled until all of the particles are extremely minute. Preferably the particles are milled until the mixture may pass through a —400 mesh screen. In order to provide an even more homogeneous mixture, it may be desirable to form the cermet mixture by employing a noble metal resinate or other noble metal solution which is mixed with the glass particles and then calcined for a period to drive off the volatiles. This forms a glass frit having microscopic noble metal particles attached to the surfaces of the glass particles. This mixture is then further ground and mixed with a volatile carrier to be applied in the aforesaid manner to the substrate. While the percentage of metal in the mixture may vary in accordance with the type of metal employed, it is usually desirable to employ a noble metal and glass particle mixture in which the noble metal particles comprise at least 40% of the total mixture by weight. Preferably, the metal particles comprise 60 to 90% by weight of the total mixture to assure good conductive path through the cermet bond. One example of such a mixture employed to make a cermet bond comprises 15% glass ($Bi_2O_3$ and CdO formed in percentages as described above) and 85% silver particles in finely divided form.

Figure 6:
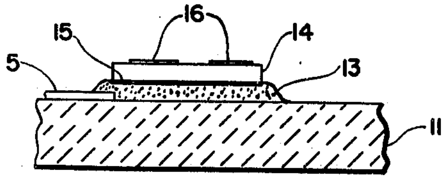
FIGURE 6 is a cross-sectional view of another embodiment of a substrate base member employing a cermet pad for attaching a transistor chip directly to the surface of the substrate.

As may be seen in FIGURE 6, there is shown another embodiment of the invention in which the cermet material 13 forms a direct bond to the nonconductive substrate 11 with only a portion thereof overlying the conductive film layer 5. The cermet material 13 serves both as a bonding material to the substrate 11 and forms a header or conductive attachment to the collector 15 or other electrode of the transistor chip.

While in accordance with the patent statutes there has been described what at present is considered to be preferred embodiments of the invention, it will be obvious to those skilled in the art that various changes and modifications may be made therein without departing from the invention and it is, therefore, the aim of the dependent claims to cover all such changes and modifications as fall within the true spirit and scope of the invention.

What is claimed is:

1. An electrical circuit module comprising:
a nonconductive base member;
a thin conductive layer attached to at least one face of said base member in the form of an electrical circuit;
a semiconductor chip having one surface thereon adapted to be attached to said base member;
an electrically conductive cermet material formed of finely divided conductive metal particles uniformly distributed throughout a fused glass binder interposed between said base member and said one surface of said semiconductor chip, said cermet material overlying at least a portion of said thin conductive layer thereby bonding said semiconductor chip to said base member with said conductive metal particles forming an electrically conductive path between said semiconductor chip and said thin conductive layer.

2. The electrical circuit module defined in claim 1 in which said semiconductor chip is a silicon or germanium solid state semiconductor device.

3. The electrical circuit module defined in claim 1 in which said base member comprises a high temperature resistant, nonconductive, ceramic substrate.

4. The electrical circuit module defined in claim 1 in which said conductive cermet material includes metal particles formed of one or more of the noble metals selected from the group consisting of gold, silver, palladium, platinum, ruthenium and iridium.

5. The electrical circuit module defined in claim 1 in which said glass binder material is formed of a glass having a softening temperature not greater than the maximum temperature limit of said semiconductor chip.

6. The electrical circuit module defined in claim 1 in which said glass binder material is formed of a glass having a melting temperature below 450° C.

7. An electrical circuit module comprising:
a nonconductive base member;
a semiconductor chip having at least one electrode surface thereon adapted to be electrically attached to a conductive header;
a thin film conductive layer bonded to at least one face of said base member in the form of an electrical circuit, said thin film layer including at least one header having a shape adapted to support thereabove said one electrode surface of said semiconductor chip;
an electrically conductive cermet material formed of finely divided conductive metal particles uniformly distributed throughout a fused glass binder interposed between said electrically conductive header and said one surface of said semiconductor chip, said glass forming a bond retaining said semiconductor chip to said heater and said conductive metal particles forming an electrically conductive path between said semiconductor chip and said header.

8. The electrical circuit module defined in claim 7 in which said semiconductor chip includes on said one electrode surface a conductive layer formed of at least one noble metal film deposited on said surface and said cermet material is bonded to said conductive layer.

9. An electrical circuit module having both active and passive electrical circuit components thereon comprising:
a high temperature heat resistant ceramic substrate member;
a thin film conductive pattern deposited on at least one face of said substrate member;
at least one passive electrical component attached to said substrate member and electrically connected to said thin film conductive pattern;
an active electrical circuit component comprising a semiconductor chip having an electrode surface thereof adapted to be attached to said substrate member;
an electrically conductive cermet material formed of finely divided conductive metal particles uniformly distributed throughout a fused glass binder interposed between said substrate member and said semiconductor chip, said cermet material overlying at least a portion of said thin film pattern thereby to bond said semiconductor chip to said substrate with said conductive metal particles forming a conductive path between said semiconductor chip and said thin film pattern.

References Cited

UNITED STATES PATENTS

| | | | |
|---|---|---|---|
| 2,809,332 | 10/1957 | Sherwood | 317—235 |
| 3,072,832 | 1/1963 | Kilby | 317—235 |
| 3,178,804 | 4/1965 | Ullery, et al. | 29—577 |

ROBERT K. SCHAEFER, Primary Examiner

J. R. SCOTT, Assistant Examiner

U.S. Cl. X.R.

317—235

UNITED STATES PATENT OFFICE
CERTIFICATE OF CORRECTION

Patent No. 3,497,774 February 24, 1970

Leon B. Hornberger et al.

It is certified that error appears in the above identified patent and that said Letters Patent are hereby corrected as shown below:

Column 6, line 27, "heater" should read -- header --.

Signed and sealed this 24th day of November 1970.

(SEAL)
Attest:

Edward M. Fletcher, Jr.
Attesting Officer

WILLIAM E. SCHUYLER, JR.
Commissioner of Patents